(12) United States Patent
Jellus et al.

(10) Patent No.: US 7,295,008 B2
(45) Date of Patent: Nov. 13, 2007

(54) MAGNETIC RESONANCE IMAGING SYSTEM AND OPERATING METHOD THEREFOR

(75) Inventors: Vladimir Jellus, Erlangen (DE); Stephan Kannengiesser, Erlangen (DE); David Andrew Porter, Hartley Wintney (GB)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/540,164

(22) Filed: Sep. 29, 2006

(65) Prior Publication Data

US 2007/0085536 A1    Apr. 19, 2007

(30) Foreign Application Priority Data

Sep. 30, 2005   (DE) ............... 10 2005 047 556

(51) Int. Cl.
    *G01V 3/00*    (2006.01)
(52) U.S. Cl. ........................ 324/309; 324/318
(58) Field of Classification Search ........ 324/300–322; 600/407–445
    See application file for complete search history.

(56) References Cited

U.S. PATENT DOCUMENTS

| | | | |
|---|---|---|---|
| 6,225,804 B1* | 5/2001 | Lai | 324/309 |
| 6,242,916 B1* | 6/2001 | King | 324/309 |
| 6,289,232 B1* | 9/2001 | Jakob et al. | 600/410 |
| 6,489,765 B2* | 12/2002 | Goto | 324/307 |
| 6,556,010 B2* | 4/2003 | Van Den Brink et al. | 324/309 |
| 6,573,717 B2* | 6/2003 | Thesen | 324/307 |
| 6,841,998 B1* | 1/2005 | Griswold | 324/309 |
| 7,050,617 B2* | 5/2006 | Kiefer et al. | 382/131 |
| 7,176,686 B2* | 2/2007 | Katscher et al. | 324/309 |
| 7,202,663 B2* | 4/2007 | Huang | 324/307 |
| 2005/0100202 A1 | 5/2005 | Huang | |
| 2006/0264735 A1* | 11/2006 | Stemmer | 600/410 |

FOREIGN PATENT DOCUMENTS

| | | |
|---|---|---|
| EP | 1 371 327 | 12/2003 |
| WO | WO 2004/111672 | 12/2004 |

* cited by examiner

*Primary Examiner*—Brij Shrivastav
(74) *Attorney, Agent, or Firm*—Schiff Hardin LLP

(57) ABSTRACT

In the operation of a magnetic resonance system, an RF excitation coil emits an excitation pulse such that nuclei in an examination subject are excited to emit of magnetic resonance signals. A number of local coils acquire the magnetic resonance signals emitted from the examination subject, with the magnetic resonance signals acquired by the local coils being coded in frequency space. An evaluation device accepts the magnetic resonance signals acquired by the local coils or accepts intermediate signals derived therefrom via one transmission channel per signal, and corrects the accepted signals using correction signals. The evaluation device uses the corrected signals reconstructing an image of the examination subject. The evaluation device determines the correction signals for all signals to be corrected using the same reference signal.

8 Claims, 3 Drawing Sheets

MAGNETIC RESONANCE IMAGING SYSTEM AND OPERATING METHOD THEREFOR

BACKGROUND OF THE INVENTION

1. Field of the Invention

The present invention concerns an operating method for a magnetic resonance system. The present invention furthermore concerns a data medium with a computer program stored on the data medium, a control and evaluation device for a magnetic resonance system and a magnetic resonance system.

2. Description of the Prior Art

Magnetic resonance systems are generally known and are normally operated as follows:

An RF excitation coil emits an excitation pulse such that nuclei in an examination subject are excited to emit magnetic resonance signals. The magnetic resonance signals emitted from the examination subject are acquired and transmitted to an evaluation device. The evaluation device corrects the transmitted signals using correction signals and uses the corrected signals for reconstruction of an image of the examination subject. The correction of the signals by the evaluation device is required in order to compensate phase errors that otherwise would lead to artifacts in the reconstruction of the image of the examination subject.

The magnetic resonance signals emitted by the examination subject can alternatively be acquired with a whole-body antenna or with one or more local coils. The present invention concerns the case of the magnetic resonance signals being acquired by local coils.

It is naturally possible for each local coil to directly supply the magnetic resonance signal acquired by it to the evaluation device. In this case, each acquired magnetic resonance signal is transmitted to the evaluation device via its own transfer channel. This operating mode is known as array operation of local coils.

It is also known for the local coils to supply the magnetic resonance signals acquired by them to a combination unit that is normally arranged in proximity to the local coils. The combination unit determines from the magnetic resonance signals a number of intermediate signals and (depending on the setting of the combination unit by an operator of the magnetic resonance system) transmits at least one intermediate signal, or possibly a number of intermediate signals, to the evaluation device. Each transmitted intermediate signal is transmitted to the evaluation device via its own transfer channel. This operating mode is known as matrix operation.

Conventionally, the correction signals are determined separately for each transfer channel. The determination normally ensues using signals acquired previously and transmitted via the respective transfer channel. For magnetic resonance signals acquired by a whole-body antenna, this procedure leads to good results. In array operation and in matrix operation of the local coils, however, it can lead to artifacts in the reconstruction (known as ghost images) which can significantly impair the quality of the reconstruction.

SUMMARY OF THE INVENTION

An object of the present invention is to provide an operating method for a magnetic resonance system, as well as a data medium, a control and evaluation device and a magnetic resonance system corresponding thereto that avoid or minimize the aforementioned artifacts.

This object is achieved by an operating method wherein the evaluation device determines the correction signals for all signals to be corrected using the same reference signal.

The object for the data medium is achieved by a computer program for implementation of such an operating method stored on the date medium when the computer program is executed by a control and evaluation device of a magnetic resonance system.

The object is also achieved by a control and evaluation device for a magnetic resonance system that is configured such to operate the magnetic resonance system according to such an operating method.

The object is further achieved by a magnetic resonance system that implements such an operating method.

The invention is based on the insight that registration signals determined on the basis of specific signal properties of some of the transmitted signals using the respective transfer channel are unsuited for determining appropriate correction signals. By not using all of the transmitted signals, a uniform correction suitable for a plurality of transmitted signals is possible. In particular it is possible for the evaluation device to determine the registration signal using a signal previously acquired by the evaluation device. If applicable, the reference signal can be determined using a combination of multiple of previously-acquired signals.

The present invention is applicable in array operation, but is applicable for matrix operation of the local coils. The local coils thus supply the magnetic resonance signals acquired by them to a combination unit that determines the intermediate signals using the magnetic resonance signals and transmits the intermediate signals to the evaluation device.

The combination unit normally is set such that it transmits only at least a first of the intermediate signals or at least one first and at least one second of the intermediate signals to the evaluation device. In this case the evaluation device advantageously determines the reference signal using a previously-transmitted first of the intermediate signals.

It is possible for the inventive operating method to be continuously executed. Preferably, however, it is executed only when it is predetermined by an operator of the magnetic resonance system that it should be executed.

DESCRIPTION OF THE PREFERRED EMBODIMENTS

Figure 1:
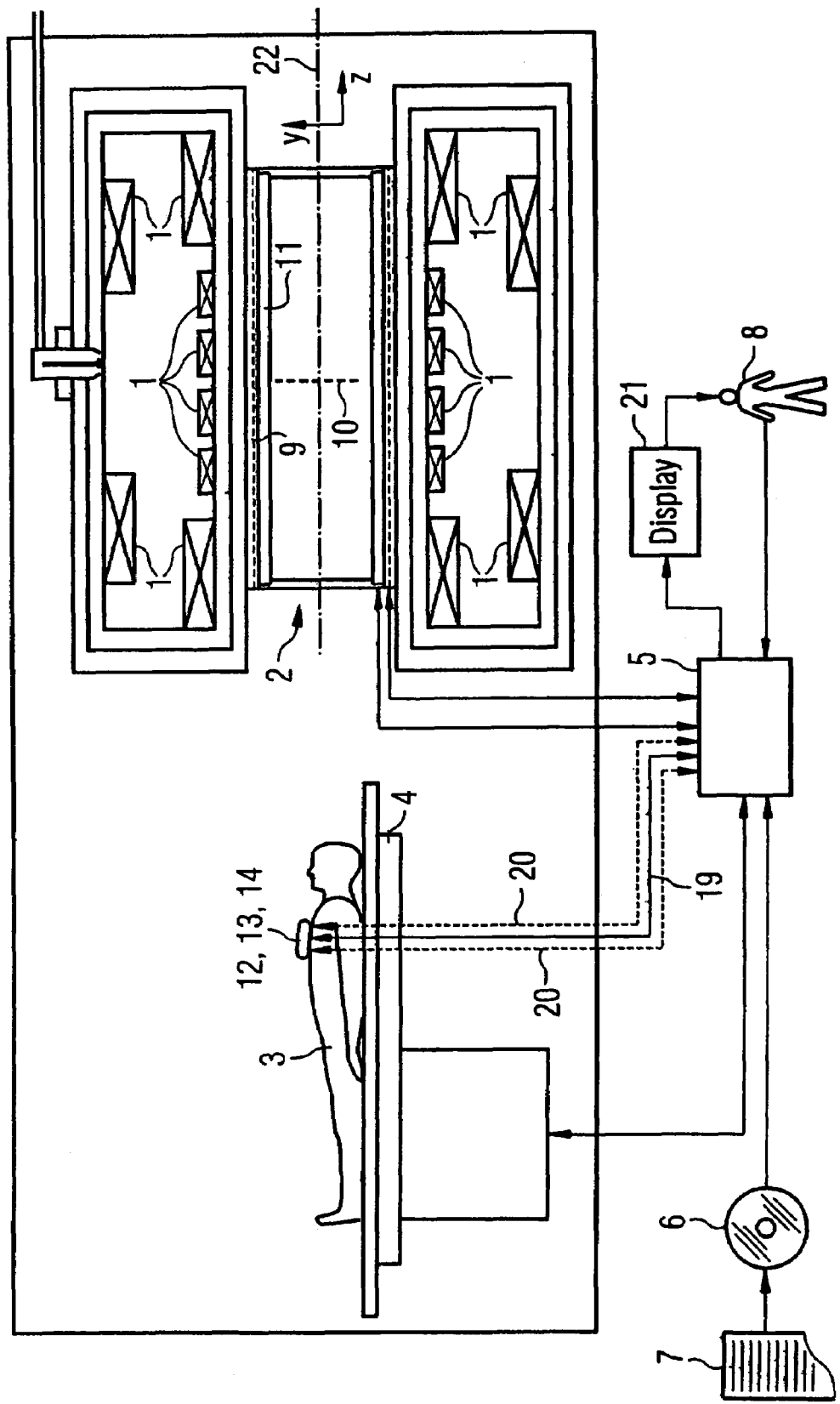
FIG. 1 schematically illustrates a magnetic resonance system operable in accordance with the invention.

As shown in FIG. 1, a magnetic resonance system has among other things, a basic magnet system 1. The basic magnet system 1 generates a temporally constant, spatially (at least essentially) homogeneous basic magnetic field in an excitation volume 2.

An examination subject 3 can be inserted into the excitation volume 2. The insertion of the examination subject 3 ensues, for example, by means of a patient bed 4 on which the examination subject 3 is arranged.

The magnetic resonance system is controlled by a control and evaluation device 5. The control and evaluation device 5 is a software-programmed control and evaluation device. A computer program 7 is supplied to it via a data medium 6 (for example a CD-ROM 6). The computer program 7 is stored (encoded) on the data medium 6. The control and evaluation device 5 is programmed by means of the computer program 7 (or is generally designed) such that it operates the magnetic resonance system according to the operating method explained in detail below, by executing the computer program 7.

Figure 2:
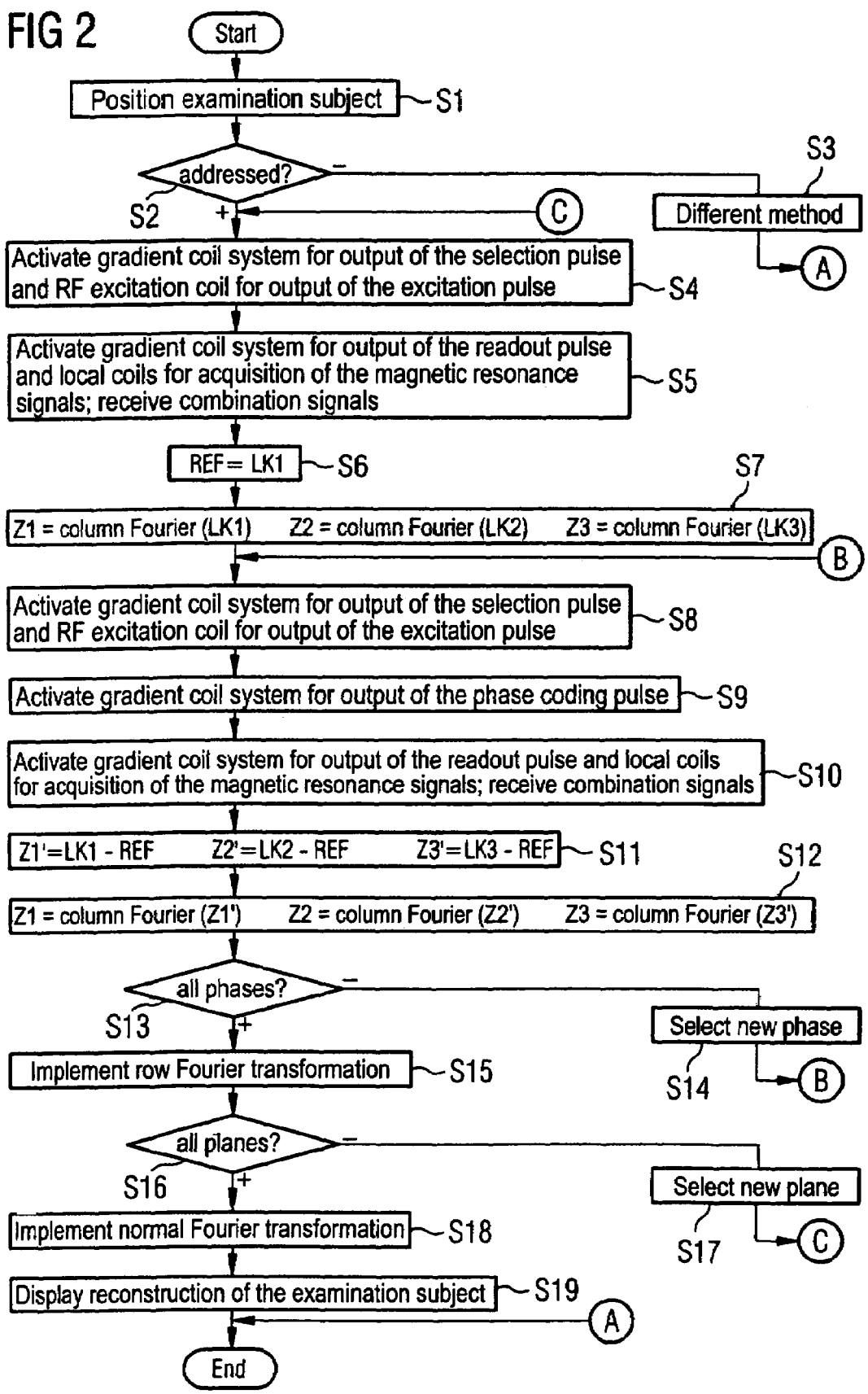
FIG. 2 is a flow chart of an embodiment of the inventive method.

According to the exemplary flow chart in FIG. 2, the control and evaluation device 5 initially positions the examination subject 3 in an excitation volume 2 in a step S1 by appropriate activation of the patient bed 4. In a step S2 the control and evaluation device 5 then checks whether a control command was provided to it by an operator 8 of the magnetic resonance system, on the basis of which control command the inventive operating method is cancelled. In the framework of the step S2, the control and evaluation device 5 thus checks whether the inventive operating method should be executed or not. If it should not be executed, the control and evaluation device 5 transitions to a step S3 in which it operates the magnetic resonance system according to a different method that is not the subject matter of the present invention. If the inventive operating method should be further executed, the control and evaluation device 5 transitions to step S4.

In the framework of step S4, the control and evaluation device 5 initially activates a gradient pulse system 9. The gradient pulse system 9 emits a selection pulse on the basis of this activation. On the basis of the selection pulse an excitation plane 10 that exhibits a row direction x (see FIG. 3) and a column direction y is normally selected within the excitation volume 2. The directions x, y normally are perpendicular to one another. It is important that they are linearly independent of one another. Simultaneously with the activation of the gradient pulse system 9 (and thus likewise in the framework of step S4) the control and evaluation device 5 also activates an RF excitation coil 11. The RF excitation coil 11 emits an RF excitation pulse on the basis of this activation. Due to the RF excitation pulse, nuclei of the examination subject 3 (insofar as they is located in the excitation plane 10) are excited to emit magnetic resonance signals.

By suitable design of the gradient pulse system 9, an area other than a plane 10 could be selected, such as a curved surface. It is important that the magnetic resonance signals are frequency-coded in a first dimension (subsequently called normal direction z) based on the selection pulse.

After the execution of step S4 the control and evaluation device 5 activates the gradient pulse system 9 again in step S5 The gradient pulse system 9 emits a readout pulse based on this activation. Based on the readout pulse, the magnetic resonance signals emitted by the examination subject 3 are likewise frequency-coded in a second dimension. The second dimension is naturally different from the first dimension.

The magnetic resonance signals are normally frequency-coded in the column direction y by the readout pulse. It is important that the frequency-coding by the readout pulse codes a further dimension within the excitation area (or the excitation plane 10).

Simultaneously with the activation of the gradient pulse system 9 for output of the readout pulse, the control and evaluation device 5 activates a number of local coils 12 through 14 so that they acquire the magnetic resonance signals that are emitted from the examination subject 3. The local coils 12 through 14 are (see FIG. 3) combined into a group. The local coils 12 through 14 of the group are arranged next to one another (in parallel) according to the example of FIG. 3 but this is not necessary.

Figure 3:
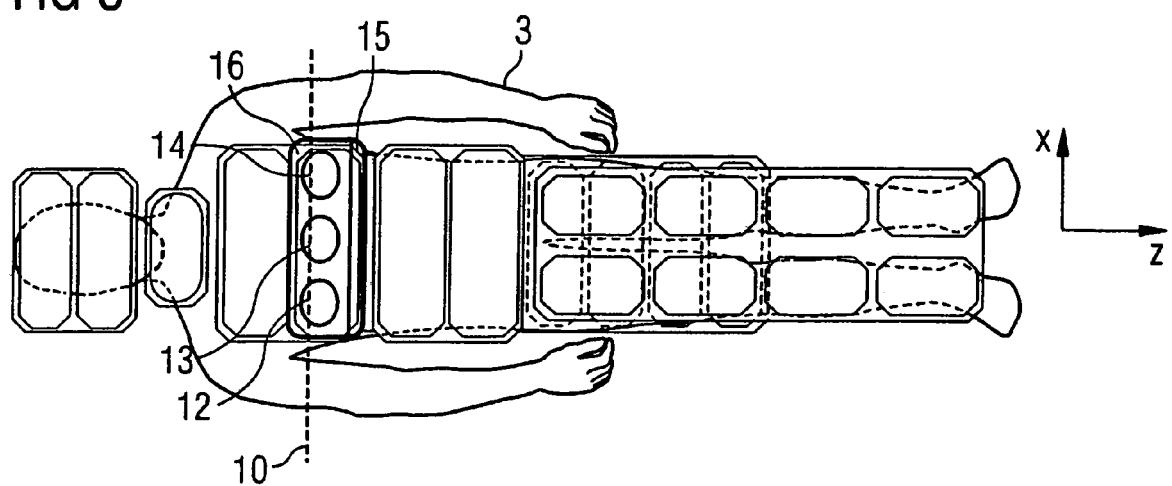
FIG. 3 shows an examination subject with local coils and a combination unit.

Only one group of local coils 12 through 14 is shown in FIG. 3. The subsequent embodiments refer to this group of local coils 12 through 14. It is naturally possible that a number of groups of local coils 12 through 14 can be present. In this case, each group of local coils 12 through 14 can be considered independently of the other groups of local coils 12 through 14.

The group of local coils 12 through 14 in this example includes three local coils 12 through 14, but more or fewer than three local coils 12 through 14 can be present.

Figure 4:
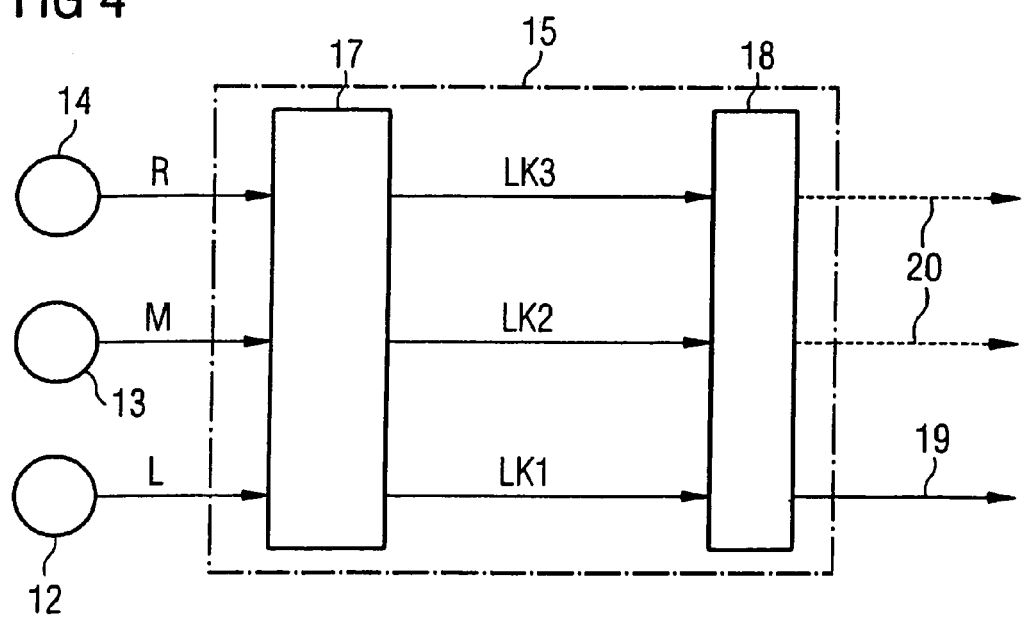
FIG. 4 schematically illustrates the determination of the intermediate signal in accordance with the invention.

The local coils 12 through 14 respectively supply the magnetic resonance signals designated L, M, R (see also FIG. 4) acquired by it to a combination unit 15. Since, due to the arrangement of the local coils 12 through 14 next to one another, the local coil 13 is arranged in the middle between the two other local coils 12, 14, its signal is subsequently designated as a middle coil signal M. The signal emitted by the left local coil 12 is correspondingly designated as a left coil signal L, the signal emitted by the right local coil 14 is designated as a right coil signal R.

As is apparent from FIG. 3, the local coils 12 through 14 and the combination unit 15 are connected into a unit by a mechanical connection structure 16. The mechanical connection structure 16 has no electrical function, but only a purely structural design function.

Independent of the presence of the connection structure 16, the combination unit 15 is arranged in proximity to the local coils 12 through 14. The combination unit 15 can be fashioned as a hardware circuit. The combination unit 15 has (see FIG. 4) a pre-processing unit 17 that determines a plurality of linear combinations LK1, LK2, LK3 from the supplied coil signals M, L, R. The linear combinations LK1, LK2, LK3 represent intermediate signals LK1, LK2, LK3 in the sense of the present invention. For example, in the present case, for three local coils 12, 13, 14, these combinations are $$LK1 = \frac{L-R}{2} - i\frac{M}{\sqrt{2}} \qquad (1)$$

$$LK2 = \frac{L+R}{\sqrt{2}} \qquad (2)$$

$$LK3 = \frac{L-R}{2} + i\frac{M}{\sqrt{2}} \qquad (3)$$

wherein $i^2 = -1$.

The combination unit 15 furthermore includes an adjustable output element 18. The output element 18 can be adjusted by an operator 8. Depending on the adjustment of the output element 18, the output element 18 outputs only a first LK1 of the intermediate signals LK1, LK2, LK3, or the first intermediate signal LK1 and a second LK2 of the intermediate signals LK1, LK2, LK3, but not a third LK3 of the intermediate signals LK1, LK2, LK2, or all three intermediate signals LK1, LK2, LK3 to the control and evaluation device 5. The first intermediate signal LK1 is thus continuously output.

Independent of how many intermediate signals LK1, LK2, LK3 the output element 18 outputs to the control and evaluation device 5, the transmission for each transmitted intermediate signal LK1, LK2, LK3 continuously ensues in its own transmission channel 19, 20. This is indicated by the dashed transfer channels 20 in FIG. 1 and FIG. 4 that are additionally present at the transfer channel 19 for the intermediate signal LK1.

The control and evaluation device 5 accepts the intermediate signals LK1, LK2, LK3 transmitted to it in the framework of the step S5. In a step S6 it determines the first intermediate signal LK1 relative to a reference signal REF. Furthermore, in a step S6 it implements a one-dimensional Fourier transformation in the column direction y and thus determines pre-processed signals Z1, Z2, Z3.

In steps S8 through S12 the control and evaluation device 5 executes a similar procedure as it was described in connection with steps S4 through S7. The steps S8, S10 and S12 correspond to the steps S4, S5 and S7. A repeat explanation of these steps is therefore not necessary for the steps S8, S10 and S12.

In step S9 the control and evaluation device 5 activates the gradient pulse system 9 such that the gradient coil system 9 emits a phase coding pulse. The magnetic resonance signals emitted by the examination subject 3 are phase-coded. The phase coding normally ensues in the row direction x, thus within the excitation plane 10 and perpendicular to the column direction y, but phase coding does not have to be perpendicular to the column direction y. It is important that it is linearly independent or different from the column direction y. As a result it is imperative that the magnetic resonance signals L, M, R acquired by the local coils 12 through 14 are frequency-coded in three dimensions (this in the entire frequency space) via the entirety of the pulses emitted by the gradient coil system 9. In step S11 the control and evaluation device 5 corrects the intermediate signals LK1, LK2, LK3 received in step S10 using the reference signal REF defined in step S6 and thus determines the corrected signals Z1', Z2', Z3'. It thus determines the correction signals REF for all signals to be corrected (here the intermediate signals LK1, LK2, LK3) using the same reference signal REF.

In step S13 the control and evaluation device 5 checks whether it has already implemented the steps S8 through S12 for all necessary phase positions. When this is not the case, in a step S14 the control and evaluation device 5 selects a new phase that has not previously been coded and then returns to the step S8.

By contrast, if all phases have already been coded the control and evaluation device 5 transitions to step S15 in which it one-dimensionally Fourier-transforms in the row direction x the entirety of the signals Z1, Z2, Z3 pre-processed in the steps S6 through S12 (the latter normally processed multiple times). It then transitions to step S16.

In step S16 the control and evaluation device 5 checks whether it has already implemented the sequence of the steps S4 through S15 for all excitation planes 10 (or, respectively, general excitation areas). If this is not the case, in step S17 the control and evaluation device selects a new excitation plane 10 (or, respectively, excitation area) and returns to the step S4. Otherwise it transitions to step S18 in which it implements a one-dimensional Fourier transformation in the normal direction z.

After implementation of step S18, the magnetic resonance signals are Fourier-transformed in all three dimensions, thus transformed in three-dimensional space. The examination subject 3 is therewith reconstructed. It is merely still necessary to unify the individual reconstructions (determined using the corrected signals Z', Z2' Z3') with one another into an (entire) reconstruction. This can ensue, for example, by a typical geometric addition, thus the generation of the square root of the sum of the squares of the individual reconstructions.

The reconstruction of the examination subject 3 (for example via a viewing device 21) can thus be output to the operator 8 of the magnetic resonance system.

Due to the inventive procedure illustrated in detail in the preceding, the control and evaluation device 5 thus draws upon the corrected signals Z1', Z2' Z3' for determination of the reconstruction of the examination subject 3.

The normal case of the inventive procedure was illustrated in the preceding. In this normal case, the determination of the magnetic resonance signals ensues in a Cartesian frequency space. This procedure is preferable, but is not absolutely necessary. In principle any type of frequency coding is possible. If applicable, the steps S7, S12 and possibly also S15 must first be executed after the step S16 for this purpose.

The inventive procedure was explained in the preceding in connection with matrix operation of the local coils 12, 13, 14, but matrix operation is not absolutely necessary. Rather, the local coils 12, 13, 14 can likewise also be operated in array operation. In this case the combination unit 15 is naturally omitted.

Additionally, the following should be noted:

The local coils 12 through 14 are arranged one after another (viewed in the row direction x) according to FIG. 1 and 3. They are thus arranged parallel to the row direction x. Although this is preferable, it is not absolutely necessary.

The excitation volume 2 is normally rotationally symmetrical around an axis of symmetry 22. The local coils 12 through 14 are arranged next to one another (viewed in the direction of the axis of symmetry 22) according to FIG. 1 and 3, thus perpendicular to the axis of symmetry 22. This is, however, not absolutely necessary.

According to FIG. 3, the local coils 12 through 14 are fashioned as thorax coils. This is, however, not absolutely necessary. The present invention is likewise in particular applicable given head coils.

Artifacts can be distinctly reduced by means of the inventive procedure. In particularly advantageous case configurations, they can even be nearly completely avoided.

Although modifications and changes may be suggested by those skilled in the art, it is the intention of the inventors to embody within the patent warranted hereon all changes and modifications as reasonably and properly come within the scope of their contribution to the art.

We claim as our invention:

1. An operating method for a magnetic resonance tomography system, comprising:

emitting an RF excitation pulse from an RF excitation coil to cause nuclei in an examination subject to emit magnetic resonance signals;

detecting the magnetic resonance signals emitted from the examination subject with a plurality of local coils;

coding the magnetic resonance signals acquired by the local coils in frequency space;

supplying the magnetic resonance signals, coded in frequency space, or intermediate signals derived therefrom, to an evaluation device via respective transmission channels with one transmission channel for each of said magnetic resonant signals, to an evaluation device;

in said evaluation device, electronically correcting the signals supplied thereto with respective correction signals for the respective transmission channels and, in said evaluation device, generating the respective correction signals using the same reference signal, and thereby generating corrected signals; and in said evaluation device, reconstructing an image of the examination subject using said corrected signals.

2. An operating method as claimed in claim 1, comprising in said evaluation device, determining said reference signal using one of the signals supplied to said evaluation device.

3. An operating method as claimed in claim 1 comprising supplying the respective magnetic resonance signals acquired by the respective local coils to a combination unit and, in said combination unit, generating respective intermediate signals from the magnetic resonance signals, and supplying said intermediate signals from said combination unit to said evaluation device.

4. An operating method as claimed in claim 3 comprising selectively setting said combination unit to transmit only a first of the intermediate signals to the evaluation unit, or only a first of the intermediate signals and a second of the intermediate signals to the evaluation device, and in said evaluation device, determining said reference signal using a previously-supplied first of the intermediate signals.

5. An operating method as claimed in claim 1 wherein said RF excitation coil, said local coils and said evaluation device are components of a magnetic resonance tomography system that also comprises a control unit, and wherein said operating method comprises manually entering a command into said control unit to execute said operating method, and executing said operating method only upon entry of said command.

6. A computer-readable medium encoded with a data structure to operate a computed tomography system having an RF excitation coil, a plurality of local coils, and an evaluation unit, said RF reception coil emitting an RF excitation pulse to cause nuclei in an examination subject to emit magnetic resonance signals, said plurality of local coils detecting the magnetic resonance signals emitted from the examination subject, the magnetic resonance signals acquired by the local coils being coded in frequency space, the magnetic resonance signals, coded in frequency space, or intermediate signals derived therefrom, being supplied to an evaluation device via respective transmission channels with one transmission channel for each of said magnetic resonant signals, to an evaluation device, said data structure causing said evaluation device to electronically correct the signals supplied thereto with respective correction signals for the respective transmission channels and, in said evaluation device, generating the respective correction signals using the same reference signal, and thereby generating corrected signals, and to reconstruct an image of the examination subject using said corrected signals.

7. An evaluation device for a magnetic resonance tomography system, said magnetic tomography system comprising an RF excitation that emits an RF excitation pulse to cause nuclei in an examination subject to emit magnetic resonance signals, a plurality of local coils that detect the magnetic resonance signals emitted from the examination subject, the magnetic resonance signals acquired by the local coils being coded in frequency space the magnetic resonance signals, coded in frequency space, or intermediate signals derived therefrom, being supplied to said evaluation device via respective transmission channels with one transmission channel for each of said magnetic resonant signals, to an evaluation device, said evaluation device electronically correcting the signals supplied thereto with respective correction signals for the respective transmission channels and, in said evaluation device, generating the respective correction signals using the same reference signal, and thereby generating corrected signals, and said evaluation device reconstructing an image of the examination subject using said corrected signals.

8. A magnetic resonance system comprising:

an RF excitation coil that emits an RF excitation pulse to cause nuclei in an examination subject to emit magnetic resonance signals;

a plurality of local coils that detect the magnetic resonance signals emitted from the examination subject;

an arrangement for coding the magnetic resonance signals acquired by the local coils in frequency space;

an evaluation unit supplied with the magnetic resonance signals, coded in frequency space, or intermediate signals derived therefrom, via respective transmission channels with one transmission channel for each of said magnetic resonant signals, to an evaluation device;

said evaluation device electronically correcting the signals supplied thereto with respective correction signals for the respective transmission channels and, in said evaluation device, generating the respective correction signals using the same reference signal, and thereby generating corrected signals; and said evaluation device reconstructing an image of the examination subject using said corrected signals.

* * * * *